United States Patent
Yen et al.

(10) Patent No.: US 8,552,457 B1
(45) Date of Patent: Oct. 8, 2013

(54) THERMAL STRESS RELEASING STRUCTURE OF A LIGHT-EMITTING DIODE

(75) Inventors: Wei-Yu Yen, Taichung (TW); Fu-Bang Chen, Taichung (TW); Chih-Sung Chang, Taichung (TW)

(73) Assignee: High Power Opto. Inc., Taichung (TW)

( * ) Notice: Subject to any disclaimer, the term of this patent is extended or adjusted under 35 U.S.C. 154(b) by 0 days.

(21) Appl. No.: 13/568,817

(22) Filed: Aug. 7, 2012

(51) Int. Cl.
*H01L 33/00* (2010.01)

(52) U.S. Cl.
USPC .............. 257/98; 257/E33.007; 257/E33.068; 257/E33.075

(58) Field of Classification Search
USPC .............. 257/98, E33.007, E33.068, E33.075
See application file for complete search history.

(56) References Cited

U.S. PATENT DOCUMENTS

| | | | |
|---|---|---|---|
| 2005/0145862 A1* | 7/2005 | Kim et al. ........................ | 257/91 |
| 2006/0234408 A1* | 10/2006 | Lee et al. ........................ | 438/22 |
| 2010/0237387 A1* | 9/2010 | Sato .............................. | 257/190 |
| 2011/0017972 A1* | 1/2011 | O'Keefe ......................... | 257/13 |
| 2011/0104836 A1* | 5/2011 | Rode et al. ..................... | 438/29 |
| 2012/0049232 A1* | 3/2012 | Okabe et al. ................... | 257/98 |
| 2013/0143342 A1* | 6/2013 | Zhu et al. ....................... | 438/29 |

* cited by examiner

*Primary Examiner* — Victor A Mandala

(74) *Attorney, Agent, or Firm* — Muncy, Geissler, Olds & Lowe, PLLC

(57) ABSTRACT

A thermal stress releasing structure is applied to a light-emitting diode (LED) which includes a P-type electrode, a permanent substrate, a binding layer, a buffer layer, a mirror layer, a P-type semiconductor layer, a light-emitting layer, an N-type semiconductor layer, and an N-type electrode that are stacked in sequence. The buffer layer includes a plurality of first material layers and a plurality of second material layers. The first material layers and the second material layers are alternately stacked in a staggered manner to form a concave-convex structure in a stacking direction of the first and second material layers. The concave-convex structure is formed in a corrugated shape to function as the thermal stress releasing structure, thus is capable of releasing thermal stress generated by thermal expansion and contraction of the buffer layer in the LED to prevent the buffer layer from damaging a metal layer or an epitaxy layer.

6 Claims, 5 Drawing Sheets

THERMAL STRESS RELEASING STRUCTURE OF A LIGHT-EMITTING DIODE

FIELD OF THE INVENTION

The present invention relates to a light-emitting diode (LED), and particularly to an LED structure with enhanced reliability.

BACKGROUND OF THE INVENTION

Referring to FIG. 1, a conventional vertical LED is formed in a sandwich structure which includes an N-type semiconductor layer 1, a light-emitting layer 2 and a P-type semiconductor layer 3. Below the P-type semiconductor layer 3, a mirror layer 4, a buffer layer 5, a binding layer 6, a silicon substrate 7 and a P-type electrode 8 are disposed in sequence. A surface of the N-type semiconductor layer 1 is processed by chemical or physical etching to increase light extraction efficiency. An N-type electrode 9 is disposed on the surface of the N-type semiconductor layer 1.

By applying a voltage between the N-type electrode 9 and the P-type electrode 8, the N-type semiconductor layer 1 provides electrons while the P-type semiconductor layer 3 provides holes. The electrons and the holes are combined in the light-emitting layer 2 to generate energy level hopping to further produce excitation light.

FIG. 2 shows a detailed structure of the conventional buffer layer 5 which consists of two different blocking materials 5A and 5B that are alternately stacked. The blocking materials 5A and 5B are selected from a group consisting of platinum, nickel, titanium, tungsten, copper, chromium, silicon and aluminum that chiefly serve for releasing thermal stress and resisting ion diffusion. The blocking materials 5A and 5B have thermal expansion coefficients between those of the silicon substrate 7 and the epitaxy of the LED and are thus capable of absorbing thermal stress generated by thermal expansion and contraction. Further, as the blocking materials 5A and 5B have stable physical property and high density, they are capable of blocking ion diffusion to prevent the epitaxy structure of the LED from being damaged.

However, the above-mentioned stress releasing structure is prone to deformations caused by extrusion and stretching of stresses when the LED undergoes numerous processes of thermal expansion and contraction. As a result, such a stress releasing structure is likely to be broken and thus forms cracks. Therefore it is apparent that releasing thermal stress merely by using the blocking materials 5A and 5B cannot achieve the thermal stress resisting effect as desired to meet actual requirements.

SUMMARY OF THE INVENTION

Therefore the primary object of the present invention is to provide a thermal stress releasing structure to release thermal stress generated during semiconductor manufacturing processes to prevent structural damages and cracks.

A thermal stress releasing structure of the present invention is applied to a light-emitting diode (LED) which includes a P-type electrode, a permanent substrate, a binding layer, a buffer layer, a mirror layer, a P-type semiconductor layer, a light-emitting layer, an N-type semiconductor layer and an N-type electrode that are stacked in sequence. The buffer layer of the present invention includes a plurality of first material layers and a plurality of second material layers. The first and second material layers are alternately stacked to form a concave-convex structure in a stacking direction of the first and second material layers.

Accordingly, in the present invention, as the concave-convex structure formed by the first material layers and the second material layers can be an elastic corrugated structure, it can absorb deformation caused by the thermal stress in the LED to thus function as the thermal stress releasing structure. Therefore the buffer layer of the LED can be prevented from damages and cracks caused by stress due to thermal expansion and contraction.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
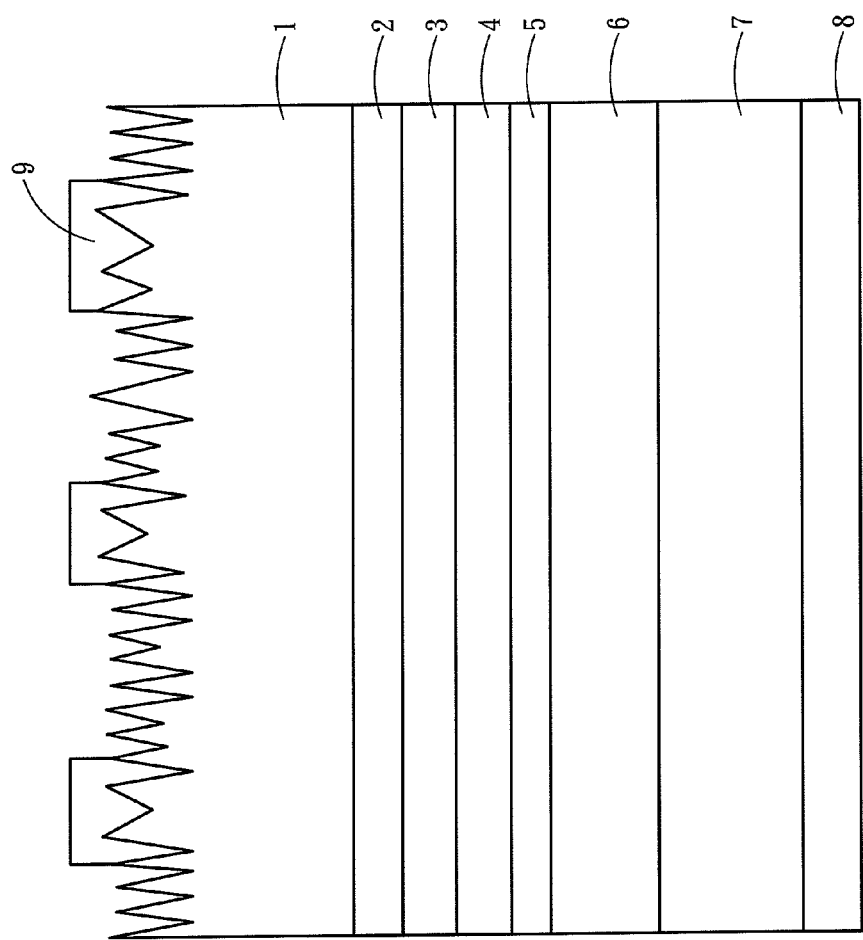
FIG. 1 is a structural diagram of a conventional light-emitting diode (LED).
Figure 2:
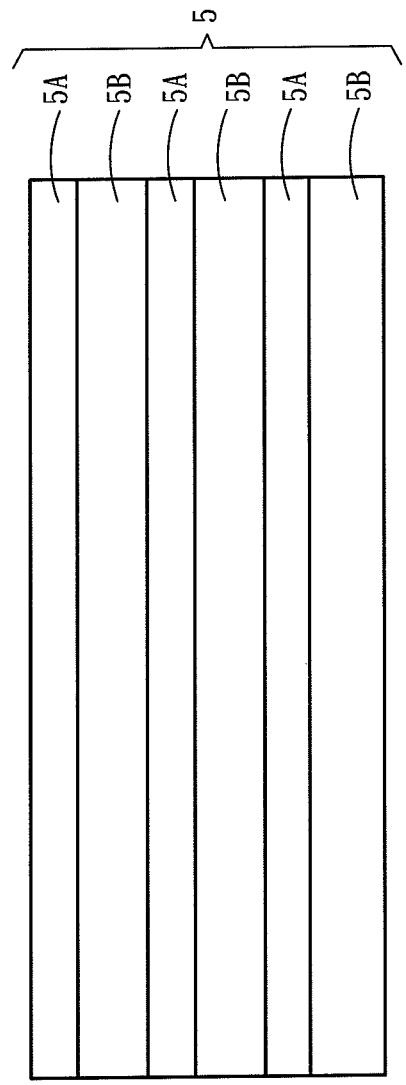
FIG. 2 is a structural diagram of a conventional buffer layer.
Figure 3:
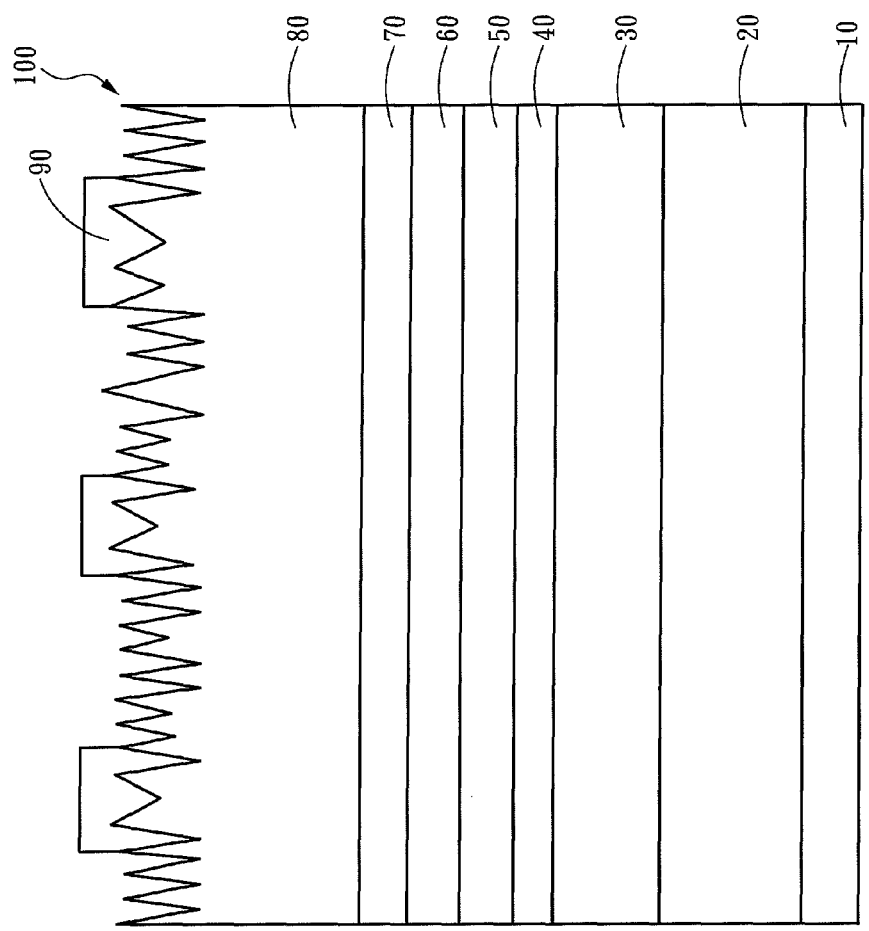
FIG. 3 is a structural diagram of an LED according to one embodiment of the present invention.

FIG. 3 shows a thermal stress releasing structure applied to a light-emitting diode (LED) 100 which includes a P-type electrode 10, a permanent substrate 20, a binding layer 30, a buffer layer 40, a mirror layer 50, a P-type semiconductor layer 60, a light-emitting layer 70, an N-type semiconductor layer 80, and an N-type electrode 90 that are stacked in sequence.

Figure 4:
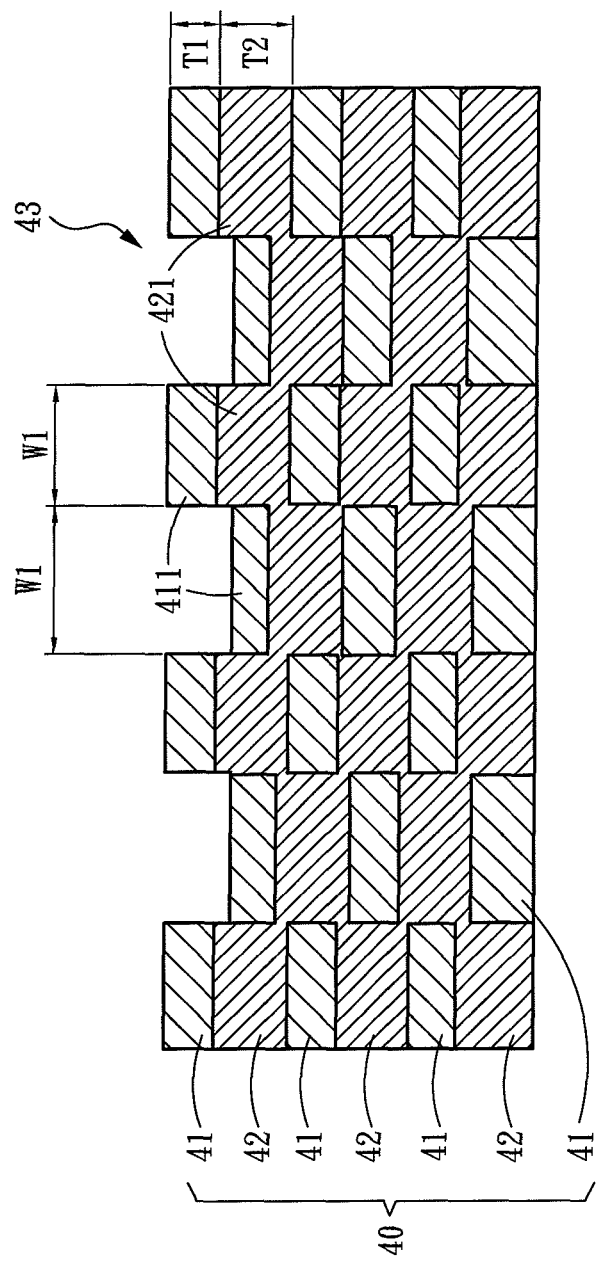
FIG. 4 is a diagram of a first embodiment of the present invention.

FIG. 4 shows a first embodiment of the present invention. In this embodiment, the buffer layer 40 includes a plurality of first material layers 41 and a plurality of second material layers 42. The first material layers 41 and the second material layers 42 include respectively a plurality of first material portions 411 and a plurality of second material portions 421. The first material portions 411 and the second material portions 421 are alternately stacked in a staggered manner both in the stacking direction thereof and in an extending direction that is perpendicular to the stacking direction to form a concave-convex structure 43 for stress releasing. Each of the first material layers 41 may be formed at a thickness T1 from 0.01 μm to 0.3 μm, each of the second material layers 42 may be formed at a thickness T2 from 0.01 μm to 0.5 μm, and each of the first material portions 411 and each of the second material portions 421 may be formed at a length W1 from 3 μm to 30 μm in the extending direction that is perpendicular to the stacking direction thereof.

In the present invention, the first material layers 41 may be made of a material selected from a group consisting of platinum, nickel, titanium, tungsten, copper, chromium, silicon, aluminum, titanium-tungsten, titanium nitride, tungsten silicide, tungsten-copper and silicon aluminum, and the second material layers 42 are made of a material different from that of the first material layers 41, which is selected from a group consisting of platinum, nickel, titanium, tungsten, copper, chromium, silicon and aluminum. In other words, the first material layers 41 and the second material layers 42 are made of two different materials, namely two materials have different physical properties.

Figure 5:
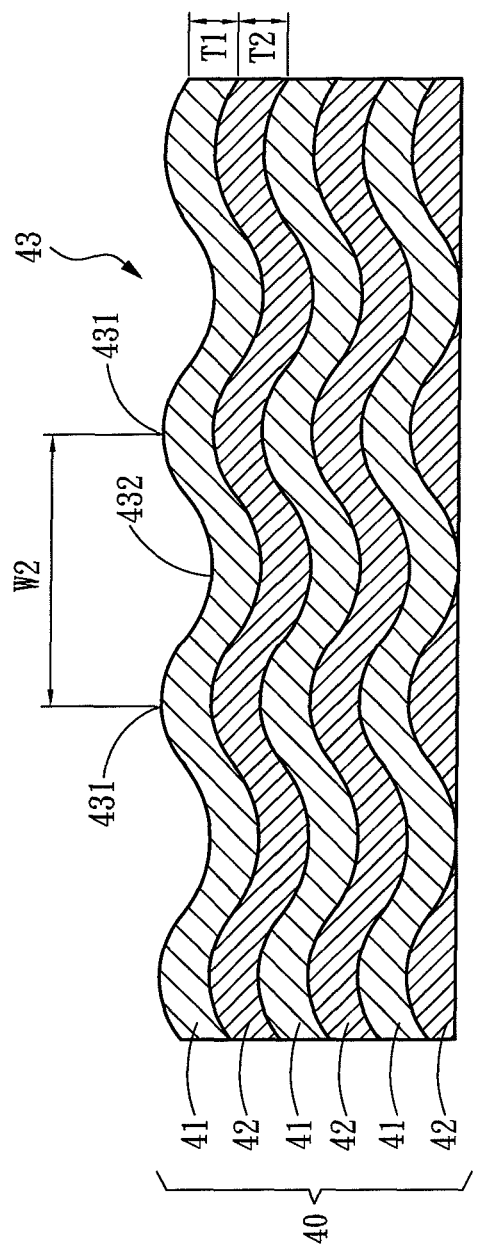
FIG. 5 is a diagram of a second embodiment of the present invention.

FIG. 5 shows a second embodiment of the present invention. In this embodiment, in order to reduce costs, a concave-convex structure 43 formed by the first material layers 41 and the second material layers 42 also can be a corrugated structure which includes a plurality of peaks 431 and a plurality of troughs 432. When manufacturing such a corrugated structure, a first material layer 41 or a plurality of protruding blocks formed by metal oxide is first provided, and then a second material layer 42 is stacked to cover the first material layer 41 or the protruding blocks. Finally, the first material layers 41 and the second material layers 42 are repeatedly and alternately stacked to form the concave-convex structure 43. Similarly, the first material layers 41 may be formed at a thickness T1 from 0.01 µm to 0.3 µm, the second material layers 42 may be formed at a thickness T2 from 0.01 µm to 0.5 µm, and at least two peaks 431 are spaced from each other at a distance W2 from 3 µm to 30 µm.

Therefore, in the present invention, as the concave-convex structure formed by the first material layers and the second material layers can be an elastic corrugated structure, it is capable of absorbing deformation caused by thermal stress in the LED to thus function as the thermal stress releasing structure. Therefore the buffer layer of the LED can be prevented from damages and cracks caused by stress due to thermal expansion and contraction.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A thermal stress releasing structure of a light-emitting diode (LED), the LED comprising a P-type electrode, a permanent substrate, a binding layer, a buffer layer, a mirror layer, a P-type semiconductor layer, a light-emitting layer, an N-type semiconductor layer, and an N-type electrode that are stacked in sequence; the thermal stress releasing structure being characterized that:

the buffer layer comprises a plurality of first material layers and a plurality of second material layers, and the plurality of first material layers and the plurality of second material layers are alternately stacked in a staggered manner to form a concave-convex structure in a stacking direction of the plurality of first material layers and the plurality of second material layers.

2. The thermal stress releasing structure of claim 1, wherein each of the plurality of first material layers and each of the plurality of second material layers include respectively a plurality of first material portions and a plurality of second material portions, and the plurality of first material portions and the plurality of second material portions are alternately stacked in a staggered manner both in a stacking direction thereof and in an extending direction that is perpendicular to the stacking direction.

3. The thermal stress releasing structure of claim 2, wherein each of the plurality of first material layers is formed at a thickness of 0.01 µm to 0.3 µm, each of the plurality of second material layers is formed at a thickness of 0.01 µm to 0.5 µm, and each of the plurality of first material portions and each of the plurality of second material portions are respectively formed at a length of 3 µm to 30 µm in the extending direction that is perpendicular to the stacking direction thereof.

4. The thermal stress releasing structure of claim 1, wherein the concave-convex structure formed by the plurality of first material layers and the plurality of second material layers is a corrugated structure including a plurality of peaks and a plurality of troughs.

5. The thermal stress releasing structure of claim 4, wherein each of the plurality of first material layers is formed at a thickness of 0.01 µm to 0.3 µm, each of the plurality of second material layers is formed at a thickness of 0.01 µm to 0.5 µm, and at least two of the plurality of peaks are spaced from each other at a distance of 3 mm to 30 µm.

6. The thermal stress releasing structure of claim 1, wherein the plurality of first material layers are made of a material selected from the group consisting of platinum, nickel, titanium, tungsten, copper, chromium, silicon, aluminum, titanium-tungsten, titanium nitride, tungsten silicide, tungsten-copper and silicon aluminum, and the plurality of second material layers are made of a material different from that of the plurality of first material layers and selected from the group consisting of platinum, nickel, titanium, tungsten, copper, chromium, silicon, and aluminum.

* * * * *